United States Patent
Suzuki et al.

(10) Patent No.: US 9,921,002 B2
(45) Date of Patent: Mar. 20, 2018

(54) RADIATOR AND ELECTRONIC DEVICE HAVING THE SAME

(71) Applicant: FUJITSU LIMITED, Kawasaki-shi, Kanagawa (JP)

(72) Inventors: Masumi Suzuki, Kawasaki (JP); Michimasa Aoki, Kawasaki (JP); Yosuke Tsunoda, Kawasaki (JP); Masaru Sugie, Kawasaki (JP); Shinichirou Kouno, Kawasaki (JP); Hiroshi Muto, Kawasaki (JP); Kenji Katsumata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 398 days.

(21) Appl. No.: 14/341,301

(22) Filed: Jul. 25, 2014

(65) Prior Publication Data
US 2014/0334095 A1 Nov. 13, 2014

Related U.S. Application Data

(62) Division of application No. 13/072,973, filed on Mar. 28, 2011, now abandoned.

(30) Foreign Application Priority Data

May 10, 2010 (JP) .................. 2010-108468

(51) Int. Cl.
*F28D 15/00* (2006.01)
*F28D 1/047* (2006.01)
(Continued)

(52) U.S. Cl.
CPC ........... *F28D 15/00* (2013.01); *F28D 1/0476* (2013.01); *F28F 9/0214* (2013.01); *G06F 1/20* (2013.01);
(Continued)

(58) Field of Classification Search
CPC .... F28D 1/05375; F28D 1/05383; F28D 1/06; F28D 1/0476; F28D 15/00; F28F 9/0202; F28F 9/0214; H01L 23/473; G06F 1/20
See application file for complete search history.

(56) References Cited

U.S. PATENT DOCUMENTS

| | | |
|---|---|---|
| 4,800,955 A | 1/1989 | Hagemeister et al. |
| 4,940,084 A | 7/1990 | Grieb |

(Continued)

FOREIGN PATENT DOCUMENTS

| | | |
|---|---|---|
| CN | 2233073 Y | 8/1996 |
| CN | 1612332 A | 5/2005 |

(Continued)

OTHER PUBLICATIONS

Chinese Office Action dated Jun. 27, 2013, issued in corresponding Chinese Patent Application No. 201110109167.8 (with English translation, 15 pages).

(Continued)

*Primary Examiner* — Tho V Duong
(74) *Attorney, Agent, or Firm* — Westerman, Hattori, Daniels & Adrian, LLP

(57) ABSTRACT

A radiator includes: a tube through which a coolant flows; and a single tank including: a supplying chamber communicating with an end of the tube, for supplying the tube with the coolant; and a collecting chamber communicating with the other end of the tube, partitioned to the supplying chamber, and for collecting the coolant discharged from the tube.

6 Claims, 9 Drawing Sheets

(51) Int. Cl.
*F28F 9/02* (2006.01)
*H01L 23/473* (2006.01)
*G06F 1/20* (2006.01)
*F28D 21/00* (2006.01)

(52) U.S. Cl.
CPC .... *H01L 23/473* (2013.01); *F28D 2021/0031* (2013.01); *H01L 2924/0002* (2013.01)

(56) References Cited

U.S. PATENT DOCUMENTS

| | | | |
|---|---|---|---|
| 4,976,310 A | 12/1990 | Jabs | |
| 4,977,956 A * | 12/1990 | Aoki | F28D 1/05366 165/153 |
| 4,986,344 A | 1/1991 | Maier | |
| 5,095,972 A * | 3/1992 | Nakaguro | F28D 1/05375 165/153 |
| 5,573,061 A | 11/1996 | Chiba et al. | |
| 5,582,239 A | 12/1996 | Tsunoda et al. | |
| 5,934,367 A | 8/1999 | Shimmura et al. | |
| 5,998,863 A * | 12/1999 | Kobayashi | F28D 15/0266 165/104.33 |
| 7,926,854 B2 | 4/2011 | Sharma | |
| 2003/0214783 A1 | 11/2003 | Narakino et al. | |
| 2004/0050533 A1* | 3/2004 | Chesser | F28D 15/043 165/46 |
| 2006/0067052 A1* | 3/2006 | Llapitan | F28D 1/05375 361/700 |
| 2006/0131009 A1 | 6/2006 | Nies | |
| 2009/0155096 A1 | 6/2009 | Czechowski et al. | |
| 2009/0236086 A1 | 9/2009 | Higashiyama et al. | |
| 2011/0289921 A1 | 12/2011 | Dethier et al. | |

FOREIGN PATENT DOCUMENTS

| | | | | |
|---|---|---|---|---|
| CN | 2854805 Y | | 1/2007 | |
| FR | 2701097 B1 * | | 4/1995 | ........... F28D 1/0417 |
| JP | 4-17262 U | | 2/1992 | |
| JP | 04-369388 A | | 12/1992 | |
| JP | 11-281291 A | | 10/1999 | |
| JP | 2000-18851 A | | 1/2000 | |
| JP | 2005-221191 A | | 8/2005 | |
| JP | 2006-132850 A | | 5/2006 | |
| JP | 2007-192441 A | | 8/2007 | |
| TW | I311903 B | | 7/2009 | |

OTHER PUBLICATIONS

Taiwanese Office Action dated Aug. 19, 2013, issued in corresponding Taiwanese Patent Application No. 100110756, wih English Summary (9 pages).

Japanese Office Action dated Dec. 10, 2013, issued in corresponding Japanese Patent Application No. 2010-108468 with English translation (6 pages).

Taiwanese Office Action dated May 21, 2014, issued in corresponding Taiwanese Patent Application No. 100110756, wih English Summary (17 pages).

Office Action dated Jun. 17, 2014, issued in corresponding Japanese Patent Application No. 2010-108468, with English Translation (5 pages).

* cited by examiner

RADIATOR AND ELECTRONIC DEVICE HAVING THE SAME

CROSS-REFERENCE TO RELATED APPLICATIONS

This application is a divisional of U.S. application Ser. No. 13/072,973 filed Mar. 28, 2011, which is based upon and claims the benefit of priority of the prior Japanese Patent Application No. 2010-108468, filed on May 10, 2010, the entire contents of which are incorporated herein by reference.

FIELD

The embodiments discussed herein are related to a radiator and an electronic device having the same.

BACKGROUND

There is known a radiator through which a coolant flows. The radiator includes two tanks and plural tubes connecting the tanks with each other. A technology relating to the radiator is disclosed in Japanese Unexamined Patent Application Publication No. 2007-192441.

The plural tubes are arranged to be aligned. In light of the heat radiation efficiency, it is preferable to provide such plural tubes. This is because the ensuring of the whole length of the tubes improves the heat radiation efficiency. However, the provision of plural tubes increases the size of the radiator in such a direction as to align the tubes.

SUMMARY

According to an aspect of the embodiments, a radiator includes: a tube through which a coolant flows; and a single tank including: a supplying chamber communicating with an end of the tube, for supplying the tube with the coolant; and a collecting chamber communicating with the other end of the tube, partitioned to the supplying chamber, and for collecting the coolant discharged from the tube.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
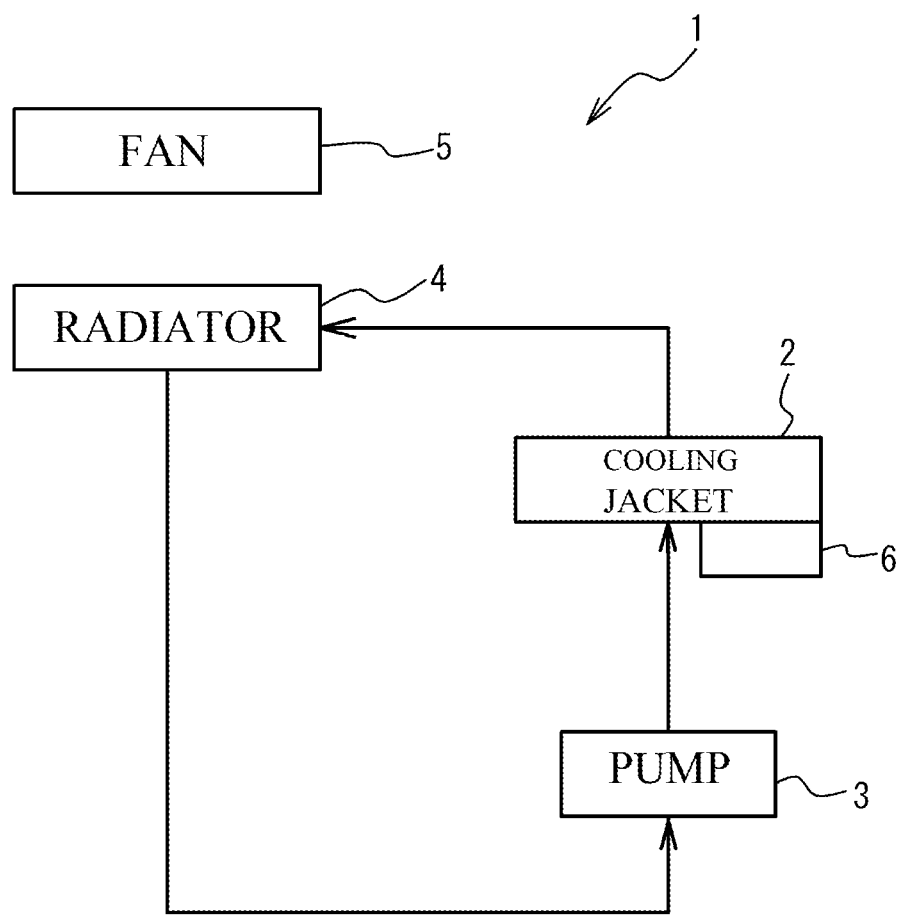
FIG. 1 is a block diagram of an electronic device.

FIG. 1 is a block diagram of an electronic device. For example, the electronic device 1 is an information processor such as a server, a desktop computer, or a notebook computer. The electronic device 1 includes a cooling system for cooling a heating part 6. For example, the heating part 6 is an electronic part such as a CPU, and develops heat in response to the power supplied. The cooling system includes a cooling jacket 2, a pump 3, a radiator 4, and a fan 5. The coolant circulates through this cooling system. The cooling jacket 2 is arranged to contact the heating part 6, and receives the heat therefrom to transmit the heat to the coolant. The pump 3 circulates the coolant. The radiator 4 receives the heat of the coolant to release the heat to air. The fan 5 sends air to the radiator 4. Units are connected to each other via a metallic pipe or a flexible hose. For example, antifreeze liquid such as propylene glycol is used as the coolant. However, the coolant is not limited to this.

Figure 2A:
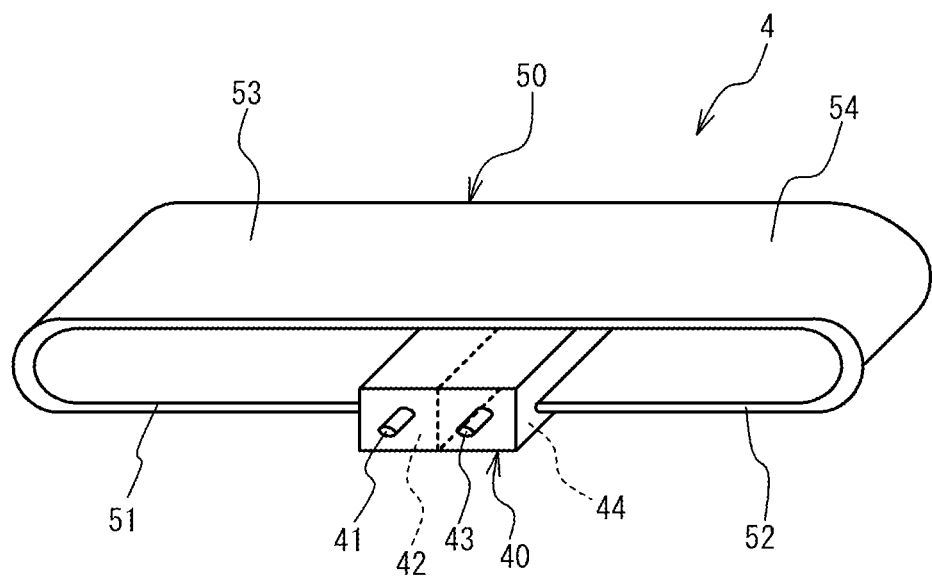
FIGS. 2A and 2B are explanatory views of a radiator according to a first embodiment.
Figure 2B:
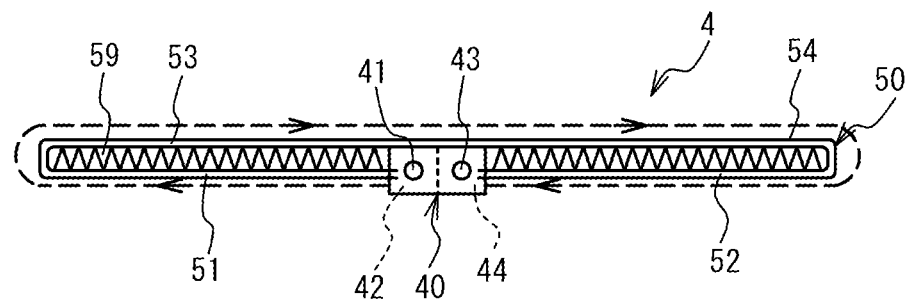

FIGS. 2A and 2B are explanatory views of the radiator 4 according to a first embodiment. The radiator 4 includes a tank 40 and a tube 50. The tank 40 and the tube 50 are each made of metal such as aluminum. The whole tube 50 has a loop shape. The coolant flows through the inside of the tube 50. The tube 50 has a flat shape.

The tube 50 includes first and second path portions 51 and 52 each extending in a given direction. The first and second path portions 51 and 52 correspond to a first extending portion. Third and fourth path portions 53 and 54 correspond to a second extending portion facing the first and second path portions. The first and second path portions 51 and 52 are substantially parallel to the third and fourth path portions 53 and 54. The first path portion 51 is continuous to the third path portion 53. The third path portion 53 is continuous to the fourth path portion 54. The fourth path portion 54 is continuous to the second path portion 52. Plural fins 59 are provided between the first and third path portions 51 and 53, and between the second and fourth path portions 52 and 54. Additionally, the fins 59 are omitted in FIG. 2A.

The tank 40 is provided between the first and second path portions 51 and 52, in other words, at a partway of the first extending portion. Specifically, the tank 40 is provided at a substantial center of the first extending portion. However, the tank 40 may be provided at a partway as far as it is not provided at the center of the first extending portion. The first and second path portions 51 and 52 extend from the tank 40 in the opposite directions. The tank 40 includes an inlet nozzle 41, a supplying chamber 42, an outlet nozzle 43, and a collecting chamber 44. The inlet and outlet nozzles 41 and 43 are respectively attached with hoses to transport the coolant. The supplying chamber 42 and the collecting chamber 44 are separated to each other. The supplying chamber 42 and the collecting chamber 44 are aligned in a direction from the first path portion 51 to the second path portion 52. The supplying chamber 42 and the collecting chamber 44 are arranged in the right and left sides. The supplying chamber 42 supplies the first path portion 51 with the coolant. The collecting chamber 44 collects the coolant discharged from the second path portion 52. The first and second path portions 51 and 52 respectively communicate to the supplying chamber 42 and the collecting chamber 44.

The coolant flows through the inlet nozzle 41, the supplying chamber 42, the first path portion 51, the third path portion 53, the fourth path portion 54, the second path portion 52, the collecting chamber 44, and the outlet nozzle 43, in this order. Additionally, the fan 5 includes a fan for sending air to a clearance between the first and third path portions 51 and 53, and another fan for sending air to a clearance between the second and fourth path portions 52 and 54.

As described above, the tank 40 is provided at a partway of the tube 50. In the tube 50, the first and third path portions 51 and 53 extend facing each other, and the second and fourth path portions 52 and 54 extend facing each other. This can reduce the height of the radiator 4, while ensuring the whole length of the tube 50. The ensuring of the whole length of the tube 50 can also ensure the heat radiation efficiency.

Further, the radiator 4 is equipped with the single tank 40, thereby reducing the number of the parts. Furthermore, the tank 40 is provided at a partway of the tube 50, whereby the tank 40 is positionally set in light of a layout of another part. This improves the design freedom of the position of the tank 40.

Second Embodiment

Figure 3:
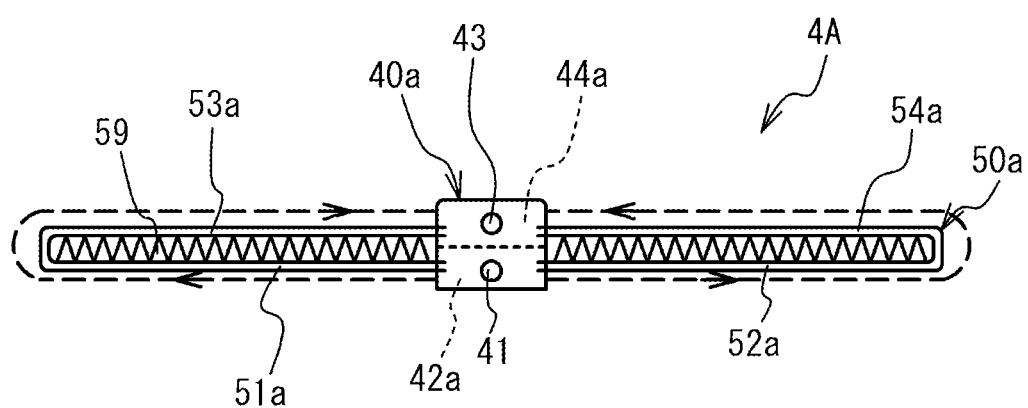
FIG. 3 is an explanatory view of the radiator according to a second embodiment.

A radiator 4A according to a second embodiment will be described. Additionally, the components similar to those of the radiator 4 according to the first embodiment are designated by the same reference numerals, and a duplicate description will be omitted. FIG. 3 is an explanatory view of the radiator 4A according to the second embodiment.

A tank 40a is provided at a partway of a loop-shaped tube 50a. The tank 40a is provided between first and second path portions 51a and 52a corresponding to a first extending portion, and between a third and fourth path portions 53a and 54a corresponding to a second extending portion. The tank 40a includes a supplying chamber 42a and a collecting chamber 44a. The supplying chamber 42a and the collecting chamber 44a are aligned in a direction from the first extending portion to the second extending portion. The supplying chamber 42a and the collecting chamber 44a are arranged in the up and down direction. The first and second path portions 51a and 52a communicate to the supplying chamber 42a. The first and second path portions 51a and 52a extend in the opposite directions from the supplying chamber 42a. The third and fourth path portion 53a and 54a communicate to the collecting chamber 44a. The third and fourth path portions 53a and 54a extend in the opposite directions from the collecting chamber 44a.

The coolant flows through the inlet nozzle 41 and the supplying chamber 42a in this order. The coolant flows from the supplying chamber 42a into both of the first and second path portions 51 and 52. Then, the coolant flows from both of the third and fourth path portions 53a and 54a into the collecting chamber 44a. Thus, the coolant flows through both of the first and third path portions 51a and 53a side and the second and fourth path portions 52a and 54a side at the same time. The fan 5 includes: a fan sending air to a clearance between the first and third path portions 51a and 53a; and another fan sending air to a clearance between the second and fourth path portions 52a and 54a.

In the first embodiment, the coolant flows through the first path portion 51, the third path portion 53, the fourth path portion 54, and the second path portion 52 in this order. In this case, the coolant sufficiently radiates heat in the first and third path portions 51 and 53 to decrease a temperature difference between the coolant and the air supplied from the fan to the clearance between the second and fourth path portions 52 and 54. This deteriorates the efficiency of the heat radiation into the air. However, in the second embodiment, the coolant flows through both of the first and third path portions 51a and 53a side and the second and fourth path portions 52a and 54a side at the same time. This ensures a sufficient temperature difference between the coolant and the air supplied from the fan to the clearance between the second and fourth path portions 52a and 54a, thereby effectively radiating heat.

Further, the tube 50a extends not to protrude from the thickness of its tank 40a in the height direction. This reduces the height of the radiator 4A.

Third Embodiment

Figure 4:
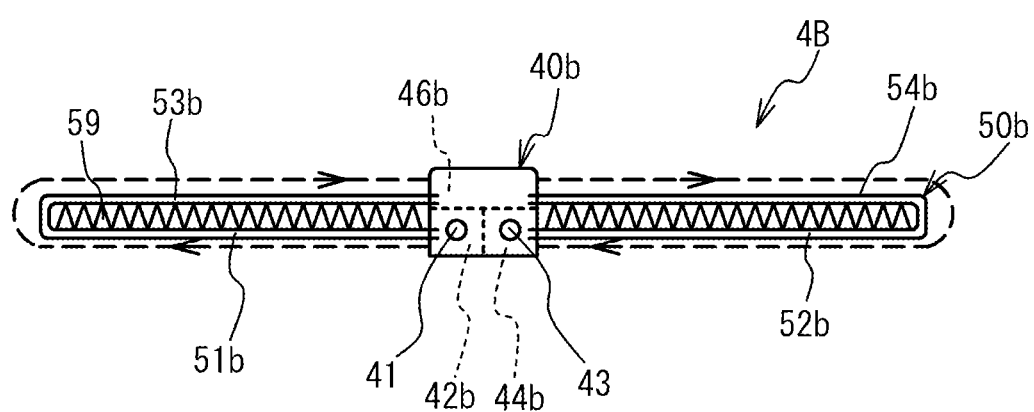
FIG. 4 is an explanatory view of the radiator according to a third embodiment.

FIG. 4 is an explanatory view of a radiator 4B according to a third embodiment. The tank 40b includes a supplying chamber 42b, a collecting chamber 44b, and a retaining chamber 46b separated from one another. The supplying chamber 42b and the collecting chamber 44b are aligned in a direction from a first path portion 51b to a second path portion 52b. The retaining chamber 46b is arranged vertically on the supplying chamber 42b and the collecting chamber 44b. The retaining chamber 46b is bigger than each of the supplying chamber 42b and the collecting chamber 44b. The third and fourth path portions 53b and 54b communicate to the retaining chamber 46b. The coolant flows through the supplying chamber 42b, the first path portion 51b, the third path portion 53b, the retaining chamber 46b, the fourth path portion 54b, the second path portion 52b, and the collecting chamber 44b, in this order.

The coolant is retained in the retaining chamber 46b. The provision of the retaining chamber 46b ensures an amount of the coolant as much as that retained in the retaining chamber 46b. Thus, it is adaptable to, for example, a case where the coolant is leaked and then its amount is reduced, or a case where the coolant expands or shrinks due to a change in its temperature. Also, the retaining chamber 46b can collect air bubbles. This prevents the air bubbles from flowing into the pump 3. Additionally, the connection point of the retaining chamber 46b and the fourth path portion 54b is positioned below the upper wall partially defining the retaining chamber 46b. The is to prevent the air bubbles collected in the retaining chamber 46b from flowing into the path portion 54b.

Fourth Embodiment

Figure 5:
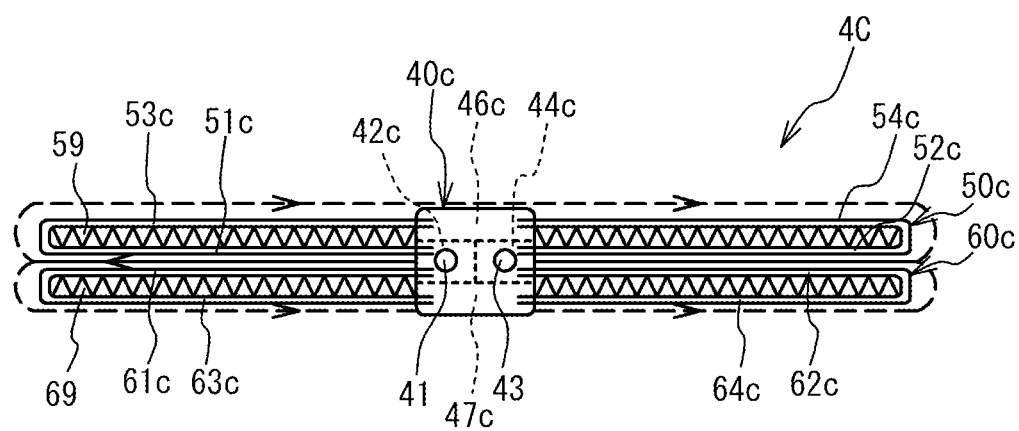
FIG. 5 is an explanatory view of the radiator according to a fourth embodiment.

FIG. 5 is an explanatory view of a radiator 4C according to a fourth embodiment. The radiator 4C includes a tank 40c, and tubes 50c and 60c. Each of the tubes 50c and 60c has a loop shape. The tank 40c is provided at partways of the tubes 50c and 60c. The tube 60c includes first and second path portions 61c and 62c corresponding to a first extending portion, and third and fourth path portions 63c and 64c corresponding to a second extending portion. The first path portions 51c and 61c face each other. The second path portions 52c and 62c face each other. Additionally, the tube 50c is similar to the tube 50b according to the third embodiment, and a description of the tube 50c is omitted.

The tank 40c includes a supplying chamber 42c, a collecting chamber 44c, and retaining chambers 46c and 47c, which are separated from one another. The retaining chamber 47c is provided under the supplying chamber 42c and the collecting chamber 44c. The first path portions 51c and 61c communicate to the supplying chamber 42c. The second path portions 52c and 62c communicate to the collecting chamber 44c. The third and fourth path portions 63c and 64c communicate to the retaining chamber 47c. The coolant flows through the inlet nozzle 41 and the supplying chamber 42c, and flows therefrom into both of first path portions 51c and 61c. The coolant that has flowed through the first path portion 61c flows through the third path portion 63c, the retaining chamber 47c, the fourth path portion 64c, the second path portion 62c, the collecting chamber 44c, and the outlet nozzle 43, in this order. The coolant flows from both of second path portions 52c and 62c into the collecting chamber 44c.

As described above, the radiator 4C includes two tubes 50c and 60c. This can ensure the whole length of each of the tubes 50c and 60c and reduce the height of the radiator 4C. Further, the tank 40C is provided with the retaining chamber 47c through which the coolant flowing through the tube 60 flows, and is also provided with the retaining chamber 46c through which the coolant flowing through the tube 50c. Therefore, the flow rate of the coolant flowing through the tube 50c is substantially identical to that of the coolant flowing through the tube 60c. Further, there is no fin between the tubes 50c and 60c. However, a fin may be provided therebetween.

Fifth Embodiment

Figure 6:
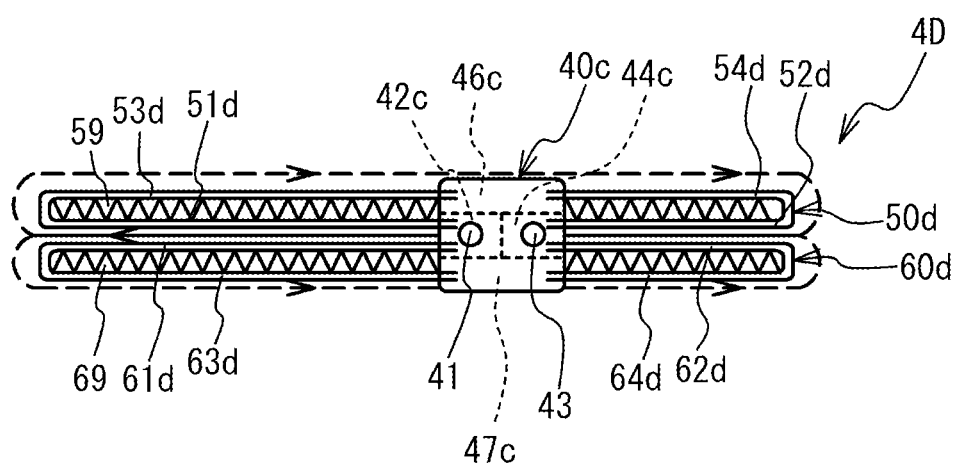
FIG. 6 is an explanatory view of the radiator according to a fifth embodiment.

FIG. 6 is an explanatory view of a radiator 4D according to a fifth embodiment. A tank 40c is provided at partways of tubes 50d and 60d. Specifically, the tank 40c is provided at a position slightly displaced from the centers of the tubes 50d and 60d. In this way, in consideration of a layout with another unit except the radiator 4D, the tank 40c can be set at such a position to easily attach the hoses to the inlet and outlet nozzles 41 and 43.

Sixth Embodiment

Figure 7:
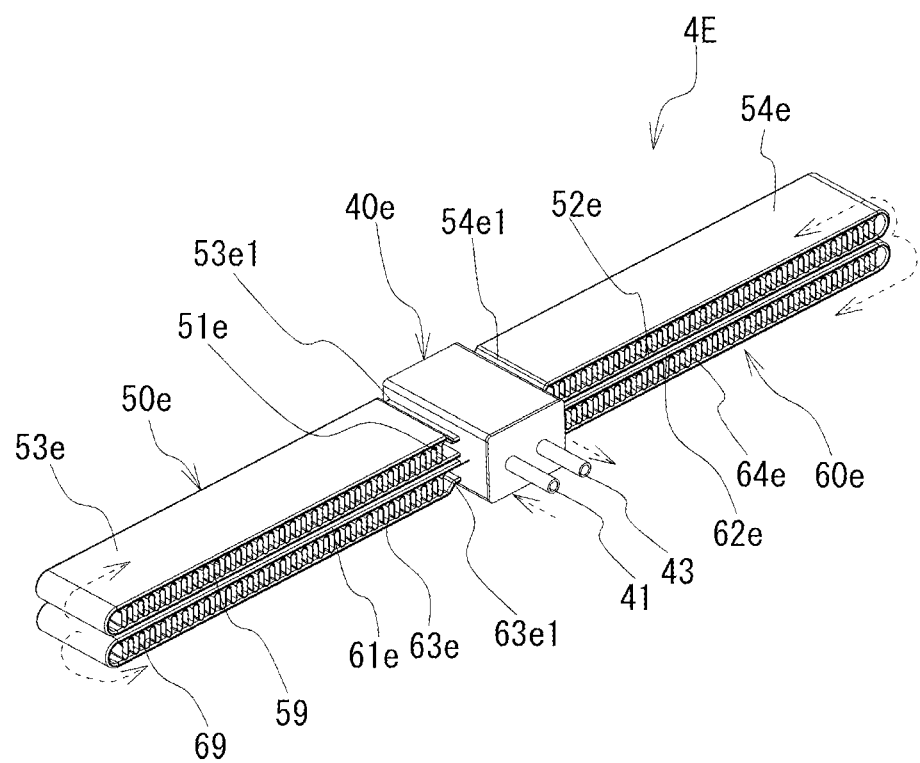
FIG. 7 is an explanatory view of the radiator according to a sixth embodiment.
Figure 8:
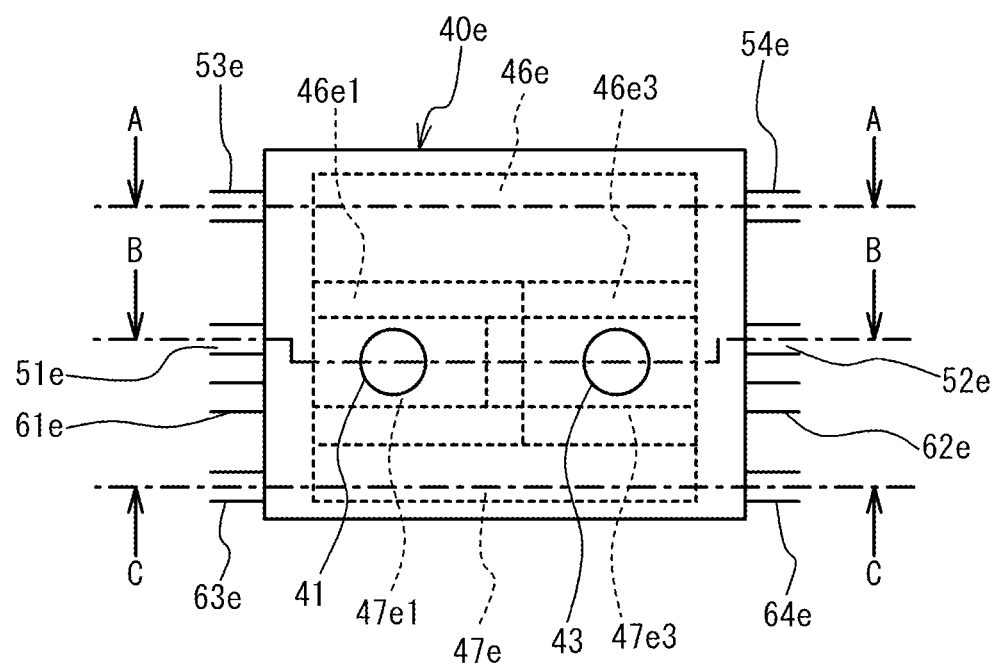
FIG. 8 is a front view of a tank.
Figure 9A:
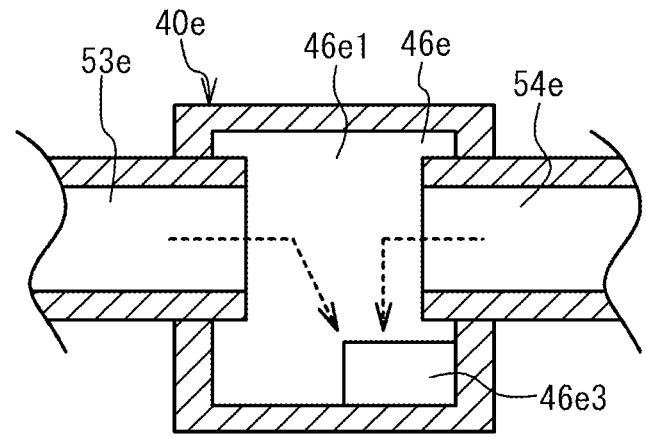
FIG. 9A is a sectional view of line A-A of FIG. 8.
Figure 9B:
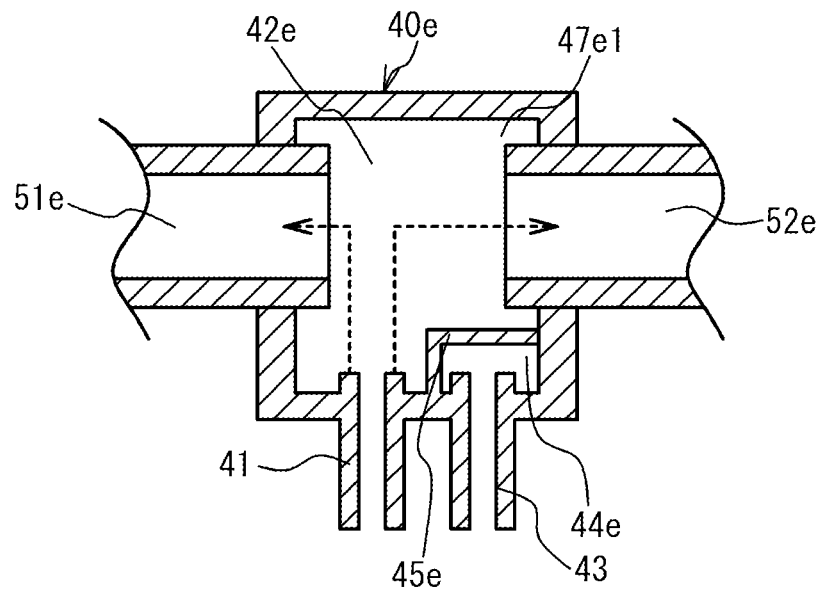
FIG. 9B is a sectional view of line B-B of FIG. 8.
Figure 9C:
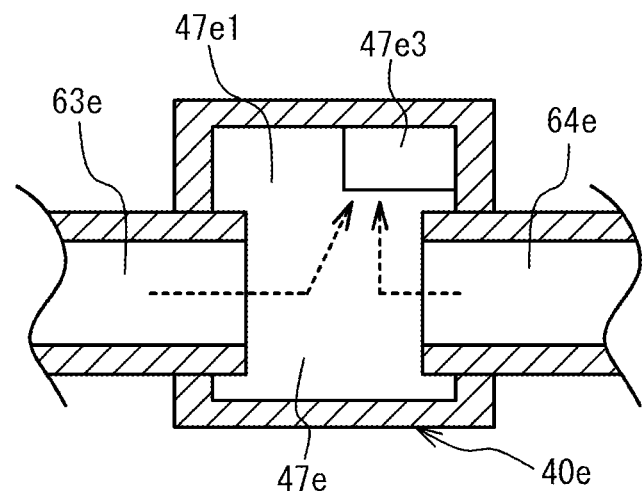
FIG. 9C is a sectional view of line C-C of FIG. 8.

FIG. 7 is an explanatory view of a radiator 4E according to a sixth embodiment. FIG. 8 is front view of a tank 40e. FIG. 9A is a sectional view of line A-A of FIG. 8. FIG. 9B is a sectional view of line B-B of FIG. 8. FIG. 9C is a sectional view of line C-C of FIG. 8. First path portions 51e and 61e and second path portions 52e and 62e communicate to a supplying chamber 42e. Third and fourth path portions 53e and 54e communicate to a retaining chamber 46e. Third and fourth path portions 63e and 64e communicate to a retaining chamber 47e. The retaining chambers 46e and 47e communicate to a collecting chamber 44e.

The tank 40e will be described in detail. As illustrated in FIG. 9B, the supplying chamber 42e and the collecting chamber 44e are separated by a partition wall 45e. The supplying chamber 42e is bigger than the collecting chamber 44e. The coolant flows from the inlet nozzle 41 through the supplying chamber 42e, and flows therefrom through the first path portions 51e and 61e and the second path portions 52e and 62e. The coolant, which has flowed through the first path portion 51e, flows into the third path portion 53e. The coolant, which has flowed through the second path portion 52e, flows into the fourth path portion 54e. The coolant flows from the third and fourth path portions 53e and 54e into the retaining chamber 46e.

As illustrated in FIG. 9A, an opening 46e3 is formed in a partition wall 46e1 partitioning the retaining chamber 46e and the supplying chamber 42e. The opening 46e3 communicates to the collecting chamber 44e. That is, the retaining chamber 46e and the collecting chamber 44e communicate to each other. Therefore, the coolant, which has flowed from the third and fourth path portions 53e and 54e through the retaining chamber 46e, flows into the collecting chamber 44e.

Further, the coolant, which has flowed through the first path portion 61e, flows into the third path portion 63e. The coolant, which has flowed through the second path portion 62e, flows into the fourth path portion 64e. The coolant flows from the third and fourth path portions 63e and 64e into the retaining chamber 47e. As illustrated in FIG. 9C, an opening 47e3 is formed in a partition wall 47e1 partitioning the retaining chamber 47e and the supplying chamber 42e. The opening 47e3 communicates to the collecting chamber 44e. That is, the retaining chamber 47e and the collecting chamber 44e communicate to each other. Therefore, the coolant, which flowed from the third and fourth path portion 63e and 64e into the retaining chamber 47e, flows into the collecting chamber 44e.

As described above, the tank 40e includes two retaining chambers 46e and 47e, thereby ensuring the quantity of the coolant, while collecting air bubbles. Also, the coolant flows from the supplying chamber 42e to the first path portions 51e and 61e arranged in left side and to the second path portions 52e and 62e arranged in right side at the same time. This prevents the deterioration of the heat radiation efficiency of the coolant flowing through any one of the sides.

Further, as illustrated in FIG. 7, the fourth path portion 54e is formed with a curved portion 54e1 at the connection portion between the fourth path portion 54e and the tank 40e. The curved portion 54e1 downwardly inclines in the direction to which the coolant flows. This prevents the coolant from flowing back from the retaining chamber 46e into the fourth path portion 54e. Further, this prevents the air bubbles collected in the retaining chamber 46e from flowing into the fourth path portion 54e. Likewise, the third path portions 53e and 63e are formed with curved portions 53e1 and 63e1 at the connection points between the third path portion 53e and the tank 40e and between the third path portion 63e and the tank 40e, respectively. Also, the fourth path portion 64e is formed with a curved portion.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:
1. A radiator comprising:
 a tube through which a coolant flows; and
 a single tank comprising:
  a supplying chamber communicating with an end of the tube, for supplying the tube with the coolant;
  a collecting chamber communicating with the other end of the tube, partitioned to the supplying chamber, and for collecting the coolant discharged from the tube;
  an inlet nozzle extending from the supplying chamber; and
  an outlet nozzle extending from the collecting chamber,
 wherein the tube comprises:

first and second path portions extending from the tank in opposite directions;
a third path portion continuous to the first path portion and facing the first path portion; and
a fourth path portion continuous to the second path portion and facing the second path portion,
wherein the first and second path portions communicate to the supplying chamber, and the third and fourth path portions communicate to the collecting chamber,
wherein the inlet nozzle and the first and second path portions are arranged in a line, when viewed in such a direction that the inlet nozzle extends,
wherein the outlet nozzle and the third and fourth path portions are arranged in a line, when viewed in such a direction that the inlet nozzle extends,
wherein an outer surface of the first path portion is opposite to an inner surface of the first path portion facing an inner surface of the third path portion and is exposed to an outside of the radiator,
wherein an outer surface of the third path portion is opposite to the inner surface of the third path portion and is exposed to the outside of the radiator, and
wherein a length of the supplying chamber in such a direction that the first path portion extends is longer than a length of the supplying chamber in a direction perpendicular to such a direction that the first path portion extends, when viewed in such a direction that the inlet nozzle extends.

2. The radiator of claim 1, wherein the supplying chamber is provided between the first and second path portions, and the collecting chamber is provided between the third and fourth path portions.

3. The radiator of claim 1,
wherein the coolant flows from the supplying chamber to the first and second path portions,
wherein the coolant flows from the first path portion to the collecting chamber through the third path portion, and
wherein the coolant flows from the second path portion to the collecting chamber through the fourth path portion.

4. The radiator of claim 1, wherein the supplying chamber and the collecting chamber are arranged in such a direction that the first and third path portions are arranged.

5. An electronic device comprising a radiator, the radiator comprising:

a tube through which a coolant flows; and
a single tank comprising:
a supplying chamber communicating with an end of the tube, for supplying the tube with the coolant;
a collecting chamber communicating with the other end of the tube, partitioned to the supplying chamber, and for collecting the coolant discharged from the tube;
an inlet nozzle extending from the supplying chamber; and
an outlet nozzle extending from the collecting chamber,
wherein the tube comprises:
first and second path portions extending from the tank in opposite directions;
a third path portion continuous to the first path portion and facing the first path portion; and
a fourth path portion continuous to the second path portion and facing the second path portion,
wherein the first and second path portions communicate to the supplying chamber, and the third and fourth path portions communicate to the collecting chamber,
wherein the inlet nozzle and the first and second path portions are arranged in a line, when viewed in such a direction that the inlet nozzle extends,
wherein the outlet nozzle and the third and fourth path portions are arranged in a line, when viewed in such a direction that the inlet nozzle extends,
wherein an outer surface of the first path portion is opposite to an inner surface of the first path portion facing an inner surface of the third path portion and is exposed to an outside of the radiator,
wherein an outer surface of the third path portion is opposite to the inner surface of the third path portion and is exposed to the outside of the radiator, and
wherein a length of the supplying chamber in such a direction that the first path portion extends is longer than a length of the supplying chamber in a direction perpendicular to such a direction that the first path portion extends, when viewed in such a direction that the inlet nozzle extends.

6. The radiator of claim 1, wherein a height of the first path portion and a height of the third path portion are lower than an upper surface of the tank and are higher than a bottom surface of the tank.

* * * * *